United States Patent [19]

Nakata et al.

[11] Patent Number: 4,458,325

[45] Date of Patent: Jul. 3, 1984

[54] CALCULATOR CAPABLE OF CALCULATING WITH ADDITIONAL EXTERNALLY INSTRUCTED UNITS

[75] Inventors: Shinichi Nakata, Kawasaki; Hiroshi Takahashi, Yokohama; Shegeru Matsuyama, Tokyo; Reiji Hirano, Yokohama, all of Japan

[73] Assignee: Canon Kabushiki Kaisha, Tokyo, Japan

[21] Appl. No.: 294,279

[22] Filed: Aug. 19, 1981

Related U.S. Application Data

[63] Continuation of Ser. No. 084,765, Oct. 15, 1979, abandoned, which is a continuation of Ser. No. 902,956, May 4, 1978, abandoned, which is a continuation of Ser. No. 764,557, Feb. 1, 1977, abandoned.

[30] Foreign Application Priority Data

Feb. 4, 1976 [JP] Japan .................................. 51-11069
Feb. 4, 1976 [JP] Japan .................................. 51-11070
Feb. 4, 1976 [JP] Japan .................................. 51-11071

[51] Int. Cl.$^3$ .......................... G06F 3/02; G06F 5/02
[52] U.S. Cl. .................................... 364/705; 235/311
[58] Field of Search ............... 235/310, 311; 364/705, 364/709, 710

[56] References Cited

U.S. PATENT DOCUMENTS

| | | | |
|---|---|---|---|
| 3,748,450 | 7/1973 | Fico et al. | 235/311 |
| 3,813,533 | 5/1974 | Cone et al. | 364/705 |
| 3,816,731 | 6/1974 | Jennings et al. | 364/705 |
| 3,855,459 | 12/1974 | Hakata | 235/310 |
| 3,973,113 | 8/1976 | Goldsamt | 364/709 |

Primary Examiner—Charles E. Atkinson
Assistant Examiner—Gary V. Harkcom
Attorney, Agent, or Firm—Fitzpatrick, Cella, Harper & Scinto

[57] ABSTRACT

Electronic data processing equipment such as an electronic computer is provided which is capable of specifying the radix or unit of input numerical data entered together with the radix or unit information manually keyed-in or automatically identified even without receiving such information. A number expressed in one radix or unit is converted into a number expressed in another radix or unit so that the arithmetic operations between the numbers expressed in different radices or units will be executed in a common radix or unit. The result may be displayed in either one of the radices or units.

4 Claims, 21 Drawing Figures

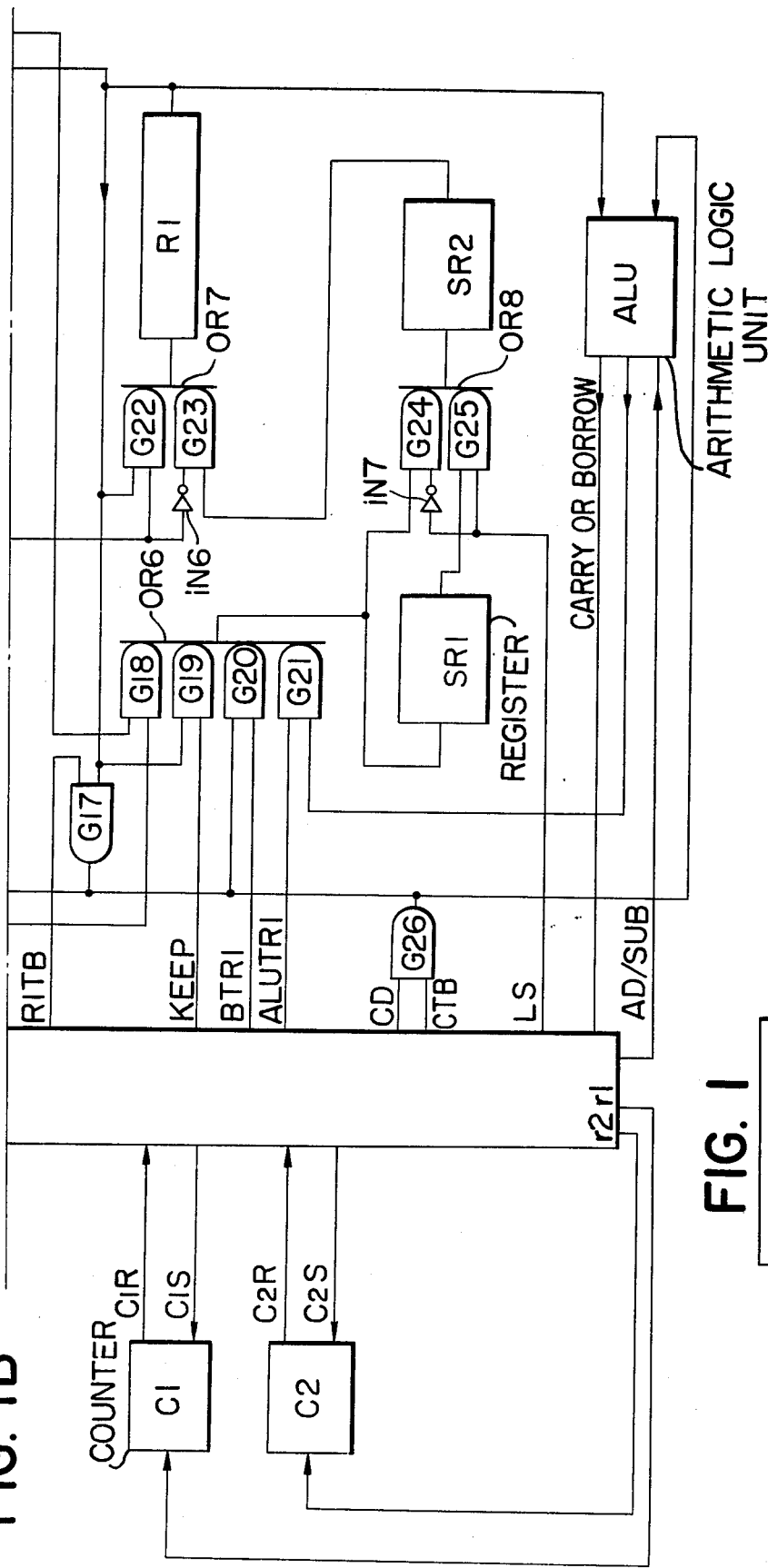

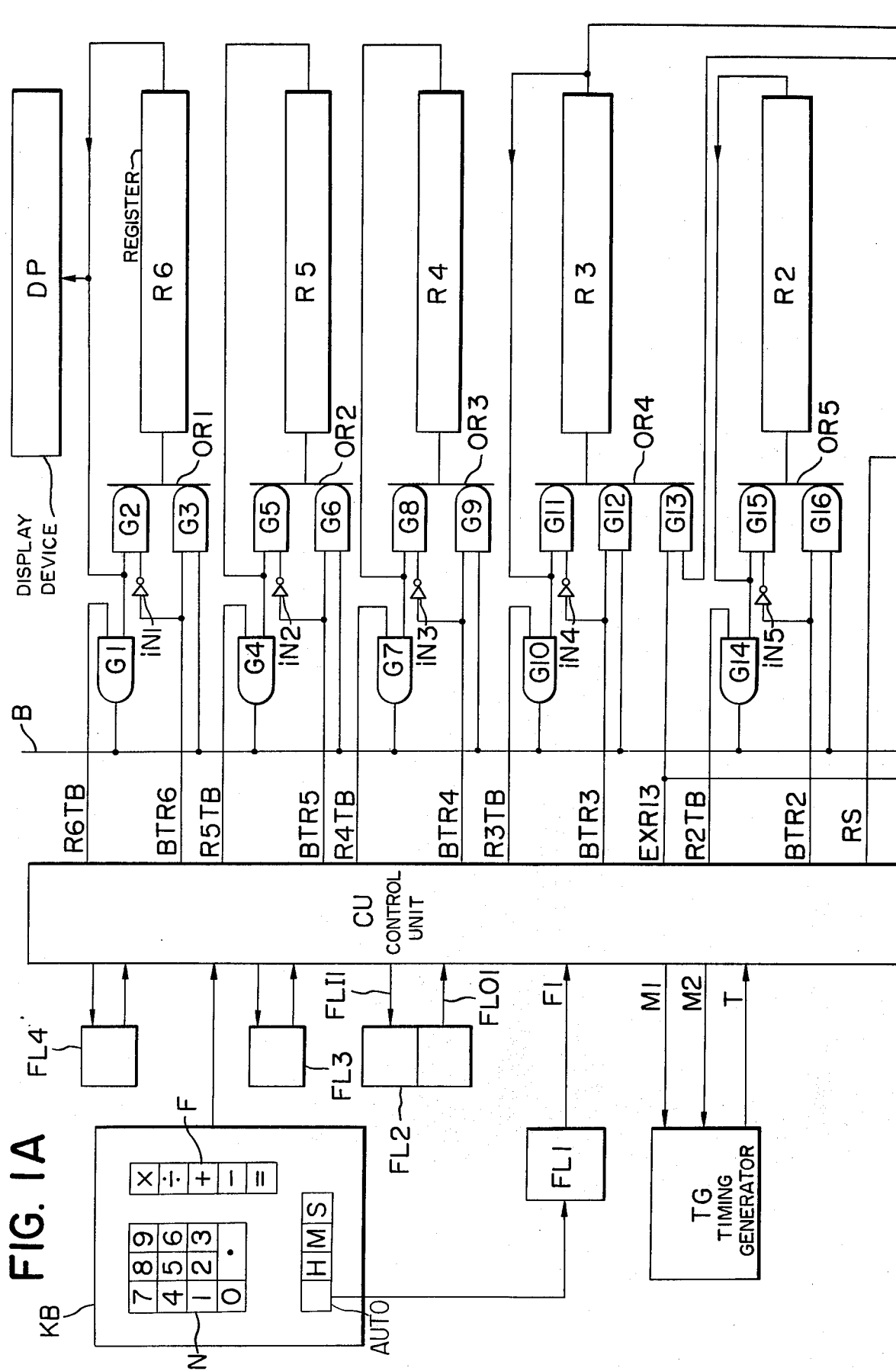

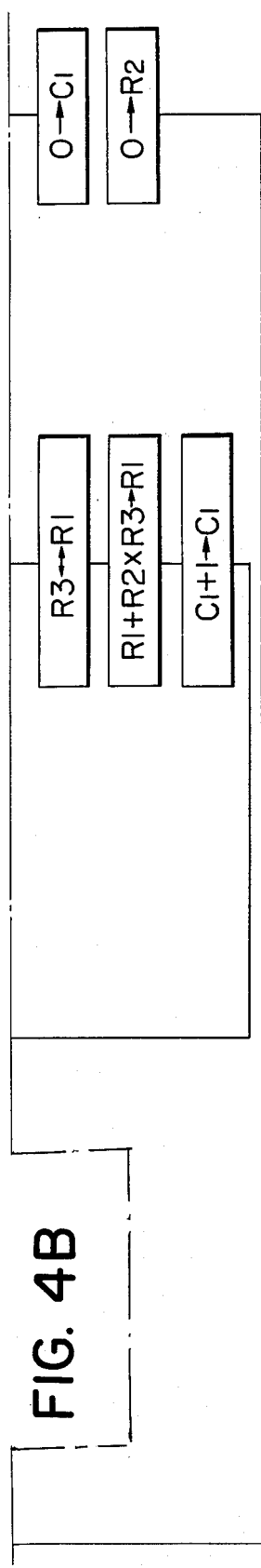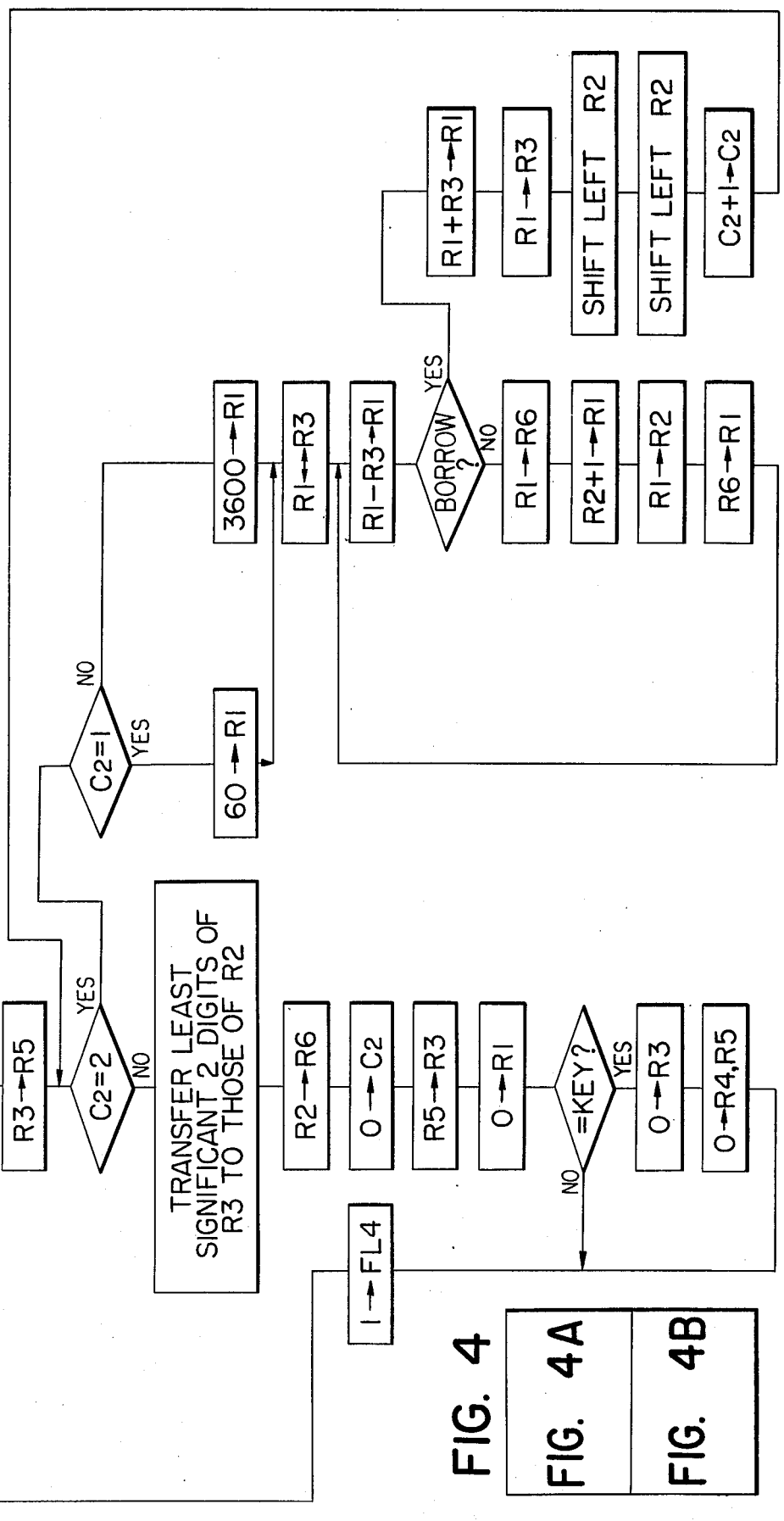
FIG. 4B
FIG. 4
FIG. 4A
FIG. 4B

FIG. 5

| KEY OPERATIONS | INDICATOR | R1 | R3 | R4 | R5 | R6 |
|---|---|---|---|---|---|---|
| 1 | 1 | 1 | | | | 1 |
| H | 1.00.00 | | 3600 | | | 10000 |
| 2 3 | 23 | 23 | | | | 23 |
| M | 1.23.00 | | 4980 | | | 12300 |
| 4 5 | 45 | 45 | | | | 45 |
| S | 1.23.45 | | 5025 | | | 12345 |
| + | 1.23.45 | | 0 | 5025 | | 12345 |
| 2 | 2 | 2 | | | | 2 |
| H | 2.00.00 | | 7200 | | | 20000 |
| 3 4 | 34 | 34 | | | | 34 |
| M | 2.34.00 | | 9240 | | | 23400 |
| 5 6 | 56 | 56 | | | | 56 |
| S | 2.34.56 | | 9296 | | 9296 | 23456 |
| = | 3.58.41 | | 14321 | | 14321 | 35841 |
| SET KEY AUTO + | 3.58.41 | | 14321 | 14321 | | 35841 |
| 1 2 | 12 | 12 | 12 | | | 12 |
| S or = | 3.58.53 | 0 | 0 | | 0 | 35853 |

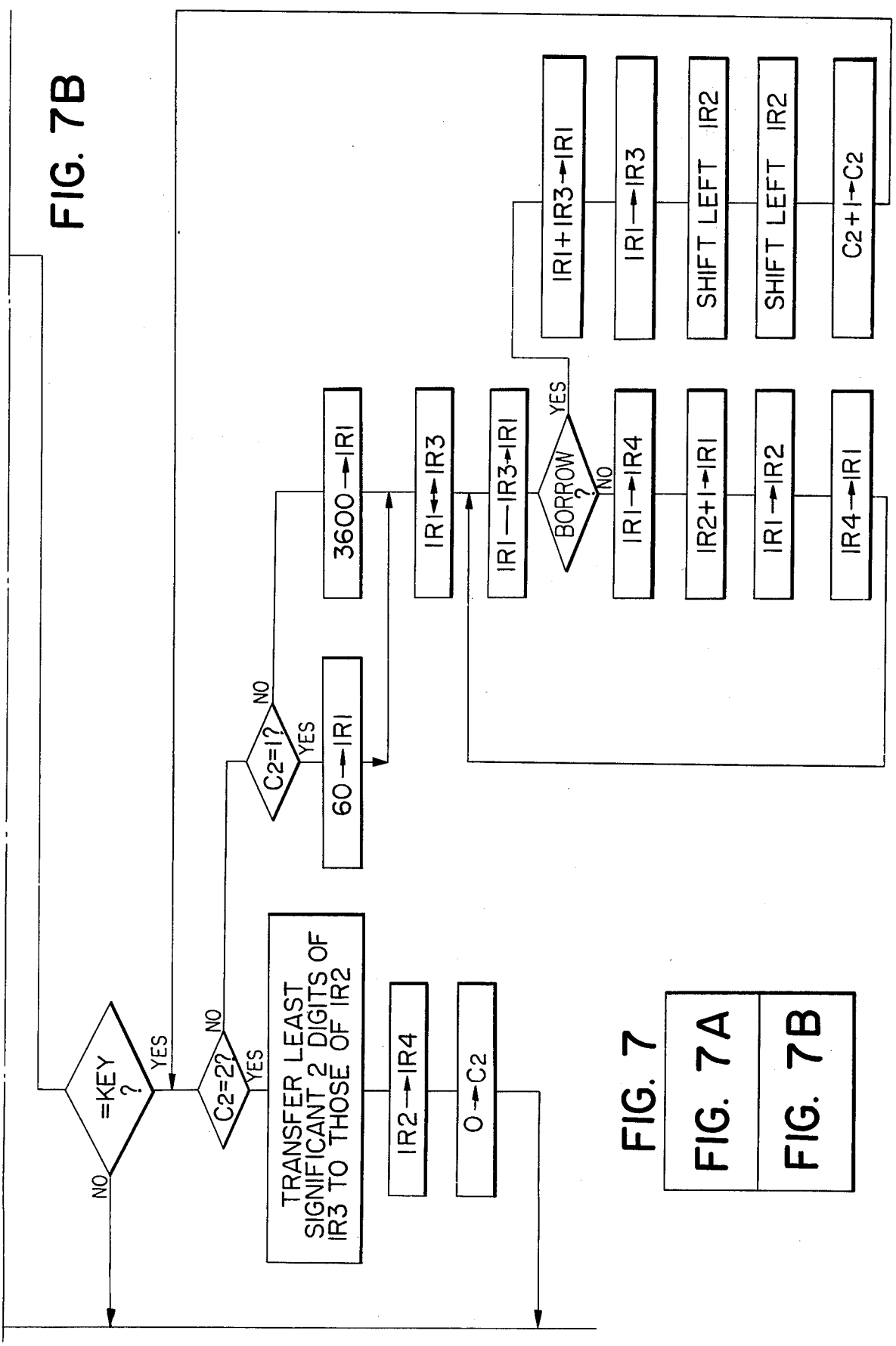

FIG. 8
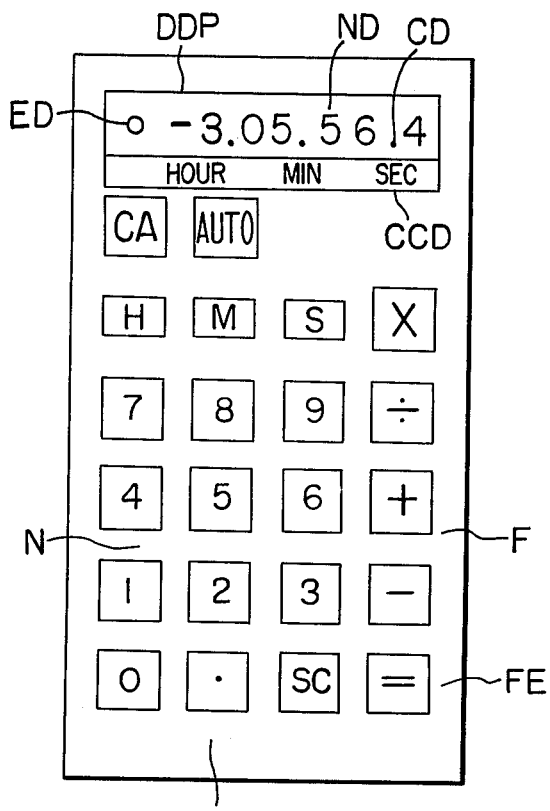
FIG. 10
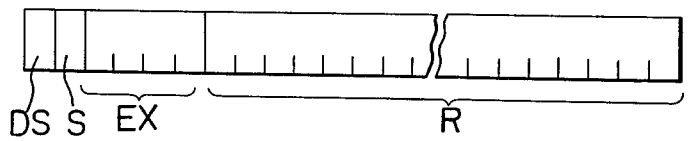
FIG. 11
| CODES OF OPCD | OPERATIONS OF AU |
|---|---|
| 0000 | NO OPERATION |
| 0001 | ADDITION |
| 0010 | SUBTRACTION |
| 0011 | MULTIPLICATION |
| 0100 | DIVISION |
| 0110 | SET |
| 0111 | RESET |
| 1001 | RIGHT SHIFT |
| 1010 | LEFT SHIFT |
| 1011 | ADD ONE |
| 1100 | SUBTRACT ONE |
| 1110 | SEXAGENARY-DECIMAL CONVERSION |
| 1111 | DECIMAL-SEXAGENARY CONVERSION |

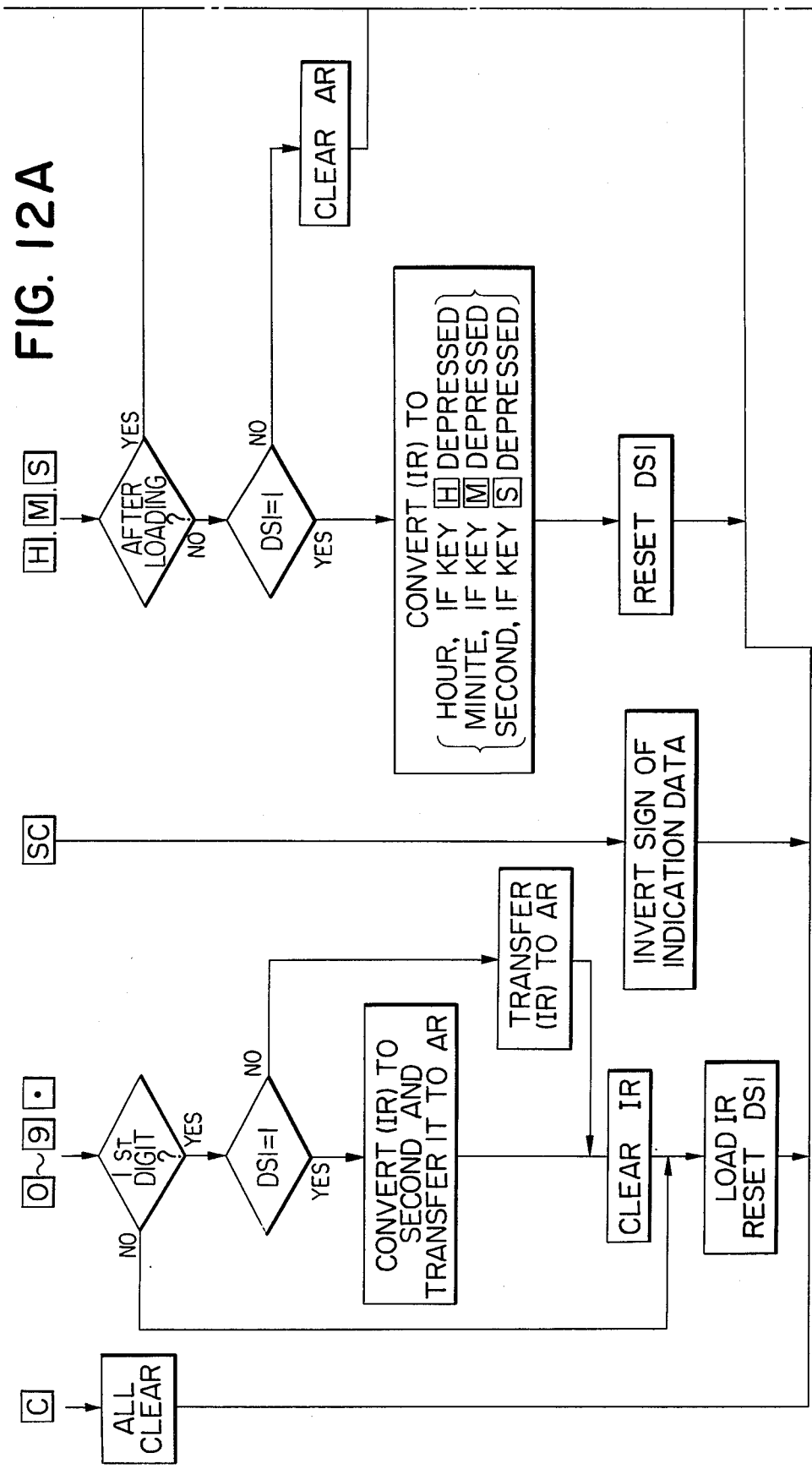

FIG. 13

| | KEY OPERATIONS | IND | IR (DS1S EX) | AR (DS2S EX) | BR (DS3S EX) |
|---|---|---|---|---|---|
| A | 3 | | 000 3 | 000 0. | 000 0 |
| B | H | 3.00.000 | 100 3 | 100 10800 | 000 0 |
| C | 1 5 M | 3.15.000 | 100 315000 | 100 11700 | 000 0 |
| D | 3 · 2 S | 3.15.132 | 100 315132 | 101 117132 | 000 0 |
| E | 2 0 · 5 SC | −20.5 | 011 205 | 101 117132 | 000 0 |
| F | M | 2.54.43.2 | 100 254432 | 101 104832 | 000 0 |
| G | ÷ | 2.54.43.2 | 100 254432 | 101 104832 | 101 104832 |
| H | 4 | | 000 4 | 101 104832 | 101 104832 |
| I | = | 43.40.8 | 100 43408 | 101 26208 | 000 4 |
| J | M | 43.6.8 | | | |
| K | M | 43.40.8 | | | |

CALCULATOR CAPABLE OF CALCULATING WITH ADDITIONAL EXTERNALLY INSTRUCTED UNITS

This is a continuation of application Ser. No. 084,765, filed Oct. 15, 1979, now abandoned which was a continuation of U.S. patent application Ser. No. 902,956, filed May 4, 1978, now abandoned, which in turn was a continuation of U.S. patent application Ser. No. 764,557, filed Feb. 1, 1977, now abandoned.

BACKGROUND OF THE INVENTION

1. Field of the Invention

The present invention relates generally to electronic data processing equipment capable of processing data expressed in different radices or units.

2. Description of the Prior Art

With the conventional electronic data processing equipment such as electronic computers, prior to arithmetic operation between numerical data in different radices or units they must be converted into a common radix or unit in representation. For instance, time is expressed in hour, minute and second units so that the arithmetic operations between two time data per se cannot be executed as can be with the case of decimal numbers. That is, they must be converted to have a common radix such as second or minute. Furthermore it is often required to express the result in the original radix or unit; that is, in hour, minute and second units. In other words, the result must be converted to be expressed in hour, minute and second units or decimal unit.

SUMMARY OF THE INVENTION

One of the objects of the present invention is therefore to provide electronic data processing equipment capable of executing arithmetic operations between numerical data in different radices or units in a very simplified manner.

Another object of the present invention is to provide electronic data processing equipment capable of automatically sensing or identifying the radix or unit of input numerical data.

A further object of the present invention is to provide electronic data processing equipment capable of executing additions and subtractions without the use or depression of addition and subtraction keys.

A further object of the present invention is to provide means capable of (1) sensing or specifying the digits in hour, minute and second units from an input numerical data when an automatic sensing key or switch is depressed even when time unit keys such as hour, minute and second keys are not depressed, (2) automatically sensing whether the result of the arithmetic operation is expressed in the decimal or time unit; that is, sexagesimal notation and (3) displaying the result in either decimal or time notation.

A further object of the present invention is to provide electronic equipment capable of executing the arithmetic operations of input time data in sexagesimal notation after these time data have been converted into an operand expressed in second unit which is the least significant unit in sexagesimal notation.

A still further object of the present invention is to provide electronic equipment capable of ensuring simple and efficient input and data processing operations.

The present invention will become more apparent from the following description of some preferred embodiments thereof taken in conjunction with the accompanying drawings.

BRIEF DESCRIPTION OF THE DRAWINGS

FIG. 1 is a block diagram of a first preferred embodiment of the present invention;

FIGS. 4 and 5 are diagrams used for explanation of the mode of operation of the first embodiment;

FIG. 8 is a top view of a keyboard of a third embodiment of the present invention;

FIG. 10 shows the construction of registers used therein;

FIG. 11 shows a table of arithmetic instruction codes and their explanation; and FIGS. 12 and 13 are diagrams used for explanation of the mode of operation of the third embodiment.

DESCRIPTION OF THE PREFERRED EMBODIMENTS

First Embodiment, FIGS. 1-5

In FIG. 1 there is shown a block diagram a first preferred embodiment of the present invention wherein in order to simplify the input of data, unit discriminating means is provided so that the input may be converted into a decimal number expressed in seconds. The first embodiment as applied to an electronic computer will be described, but it will be understood that the present invention may be also applied to other types of electronic equipment such as measuring instruments.

The electronic computer shown in FIG. 1 has a keyboard KB having a plurality of keys; that is, numeral or digit keys 0-9 and a decimal-point key (.), functional keys F +, −, ×, ÷ and =, time unit keys H, M and S, and an AUTO key for selecting a radix or unit conversion mode, which will be described in detail hereinafter.

A control unit CU, which is for example incorporated in an LSI, is responsive to the outputs from the keyboard KB for generating various control signals to be applied to circuits to be described in detail below.

A four-bit parallel register R1 is responsive to the output signals from the control unit CU and four-bit parallel registers SR1 and SR2 for (1) shifting their contents to right or left, (2) storing the output from a logical operation unit or arithmetic and logic unit ALU, and (3) exchanging data with other registers, as described below.

The register SR1 is a four-bit parallel register for delaying the data by one position when the data in the register R1 is shifted left. The register SR2 which is substantially similar in construction to the register SR1 normally constitutes a part of the shift register R1 for shifting right the data therein without passing them through the register SR2.

Registers R2, R3, R4 and R5 are four-bit parallel registers which are also responsive to the outputs from the control unit CU for data transfer and storage. A register R6 is also a four-bit parallel register which is responsive to the control signals from the control unit CU for data storage and transfer and which is connected to a display device DP having a plurality of well known seven-segment display units.

The logical operation unit ALU is responsive to operation mode signals AD or SUB from the control unit CU for executing the operation of the data stored in the register R1 and the data transmitted through a bus line B, and transmits back to the control unit CU a resultant state signal; that is, a CARRY signal in the case of addition or a BORROW signal in the case of subtraction.

Figure 2:
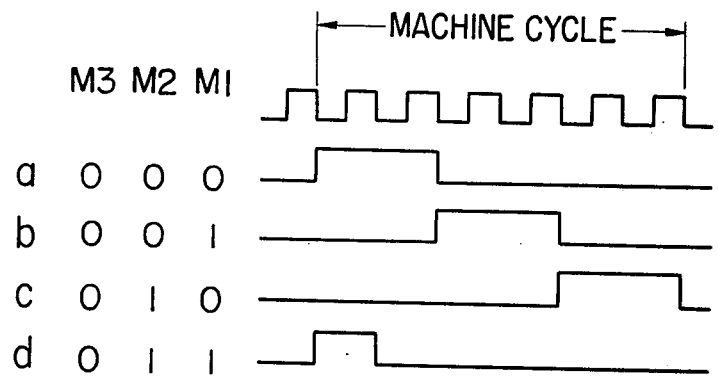
FIG. 2 shows the waveforms of output signals from a timing generator TG thereof.

A timing generator TG is responsive to timing mode signal M1 and M2 from the control unit CU to generate pulse signals a, b, c and d as shown in FIG. 2. It is shown in detail in FIG. 3 wherein a clock counter CC is connected to a decoder D which is in turn connected to an encoder E connected to a data selector DS. In response to the timing mode signals M1 and M2 the data selector DS selects one of the outputs of the encoder E so that the output signal appears at an output terminal T (See FIG. 1).

Referring back to FIG. 1, a flag FL1 is responsive to the output signal generated upon depression of the AUTO key to deliver an AUTO signal to the control unit CU.

A flag FL2 stores a coded signal of a function entered by the function key F. For instance, it receives and stores two pieces of information from the control unit CU and delivers them to it.

A flag FL3 stores the data entered or generated prior to the depression of the function key F.

A flag FL4 identifies whether or not the normal operation is to be executed.

A counter C1 is, for instance, a modulo-4 counter for discriminating input time data. A counter C2 is, for instance, a modulo-3 counter used for converting the input time data into data in hours, minutes or seconds.

AND gates G1-G26, OR gates OR1-OR8 and inverters iN1-iN7 are so interconnected that in response to the control signals from the control unit CU they control the operations of registers R1-R6.

Figure 4A:
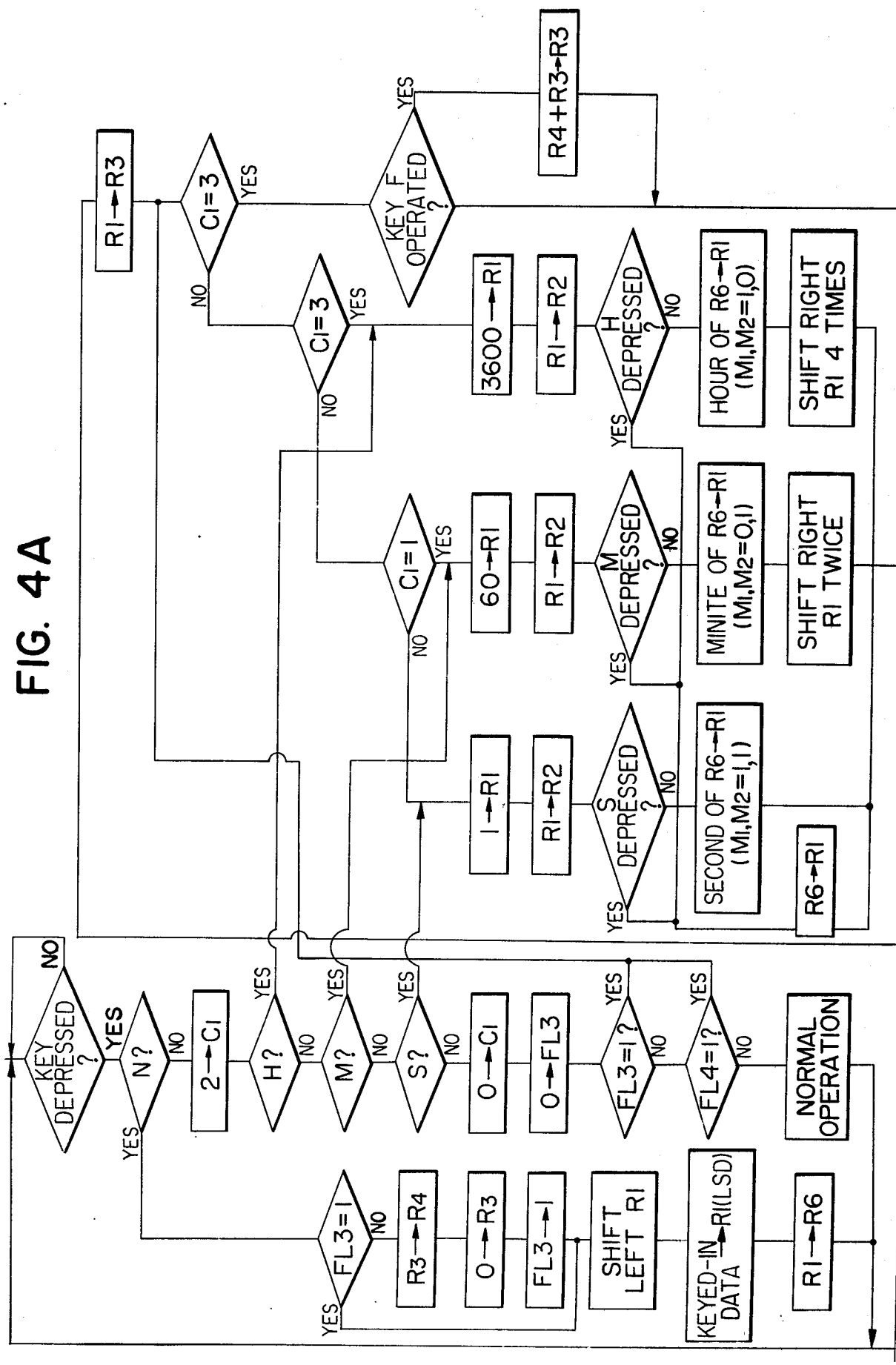

Next referring further to FIGS. 4 and 5 the mode of operation of the first embodiment with the above construction will be described below.

In response to the output signals from the keyboard KB and to the states of other circuits, the control unit CU generates the following signals:

| Terminals | Signals |
| --- | --- |
| R6TB | Signal for transferring the data in the register R6 on the bus line B |
| BTR6 | Signal for transferring the data on the bus line B to the register R6 |
| R5TB | Signal for transferring the data in the register R5 on the bus line B |
| BTR5 | Signal for transferring the data on the bus line B to the register R5 |
| R4TB | Signal for transferring the data in the register R4 on the bus line B |
| BTR4 | Signal for transferring the data on the bus line B to the register R4 |
| R3TB | Signal for transferring the data on the bus line B to the register R4 |
| R3TB | Signal for transferring the data in the register R3 on the bus line B |
| BTR3 | Signal for transferring the data on the bus line B to the register R3 |
| R2TB | Signal for transferring the data in the register R2 on the bus line B |
| BTR2 | Signal for transferring the data on the bus line B to the register R2 |
| RS | Signal for causing the right-shift of the register R1 |
| LS | Signal for causing the left-shift of the register R1 |
| R1TB | Signal for transferring the data in the register R1 on the bus line B |
| BTR1 | Signal for transferring the data on the bus line B to the register R1 |
| ALUTR1 | Signal for transferring the output from the logical operation unit ALU to the register R1 |
| M1, M2 | Two-bit signals setting the timing of the timing generator |
| EXR13 | Signal for causing the exchange of data between the registers R1 and R3 |
| CD | Four-bit data signal |
| CTB | Signal for transferring CD signal on the bus line B |
| AD | Signal for causing the logical operation unit ALU to execute an addition; that is, an operation mode signal |
| SUB | Another operation mode signal for causing the logical operation unit ALU to execute a subtraction |
| F1 | Signal generated when AUTO key is depressed |
| KEEP | Signal for causing the register R1 to hold its data |
| C1S | Signal for causing the count-up of counter C1 |
| C2S | Signal for causing the count-up of counter C2 |
| R1 | Signal for resetting the counter C1 |
| R2 | Signal for resetting the counter C2 |

The mode of operation will be described in conjunction with an addition of 1 hour 23 minutes and 45 second to 2 hours 34 minutes and 56 seconds, which addition may be executed by the following key operations.

First the numeral key [1] is depressed so that CD signal representing the input "1" appears at the output terminal CD of the control unit CU. In response to CTB signal, AND gate G26 transfers the CD signal on the bus line B and, in response to LTR1 signal, CD signal is transferred through AND gates 20 and 24 to the least significant position of the register R1. In like manner, in response to R1TB and BRT6 signals the CD signal passes through AND gates 17 and 3 into the register R6 and is displayed in the display device DP as shown in FIG. 1.

Next in order to weight the thus entered numerical data "1" with hour, the time unit key H is depressed. Then the control unit CU sets the counter C1 to "2" and starts the operation for entering the data "3600" into the register R1. More particularly, since the content of the counter C1 is "2", the four-bit parallel CD signal representing "3" is transferred to the register R1, during the timing mode M1=1 and M2=1, in a manner substantially similar to that described in conjunction with the transfer of the "1" data signal to the register R1. When the "3" signal is entered, the "1" signal disappears so that the content of the register R1 is "0 0 0 0 3" as shown in FIG. 5. In like manner number "6" is entered into the register R1 and then the content of the register R1 is shifted twice so that it changes to "0 0 3 6 0 0". Thereafter the content of the register R1 is transferred to the register R2 through AND gate 17, bus line B and AND gate 16. At this moment whether the time unit key H has been depressed or not is detected or sensed. Since the H signal is held in the control unit CU, the "1" data stored in the register R6 is transferred to the register R1 and the data exchange between the registers R1 and R3 is executed. Thereafter the logical operation unit ALU executes the operation of (data in the register R1) + (data in the register R2) ×

(data in the register R3)

and the result, that is, the data representing one hour in seconds is stored in the register R1 and the counter C1 increases incrementally.

Next the data in the register R1 is transferred to the register R3 and in response to the content of the counter C1 and after the decision of whether the function key F has been depressed or not, the counter C1 and the register R2 are cleared and the content of the register R3 is to be displayed in such a manner as described below.

First the content of the register R3 is transferred to the register R5 while the content remaining in the register R3. In response to the content of the counter C2 ("0" at present) number "3600" is entered into the register R1 in the manner described above. Thereafter the data are exchanged between the registers R1 and R3, both of which hold "3600" at this stage. However, it should be noted that the content of the register R1 is the keyed-in data whereas the content of the register R3 is the data for converting the content of the register R1 in data in time unit.

Next the arithmetic and logic unit ALU subtracts the content of the register R3 from that of the register R1 and stores the result in the register R1. Thereafter whether the operation unit ALU has generated a BORROW signal or not is detected. At this step, no BORROW signal is derived from the logical operation unit ALU so that the content of the register R2 is added with "+1". For this purpose the content of the register R1 is transferred to the register R6. Thereafter a cycle is started which causes the content of the register R6 to be transferred to the register R1 and then the subtraction of the content of the register R1. That is, the content of the register R3 is subtracted from the content of the register R1 so that the BORROW signal is derived. Therefore the content of the register R3 is added to the content of the register R1 to restore the content to its original value. Then the register with a quotient is shifted by two positions and then the counter C2 increases incrementally.

Since the content of the counter C2 is now "1", number "60" is entered into the register R1 and exchanged with the content (which is zero at this step) of the register R3. Thereafter a division is executed in order to display the keyed-in data in minutes. Since the remainder is zero, BORROW signal is derived from the operation unit ALU so that the content of the register R3 is added to the content of the register R1 and then the counter C2 increases incrementally.

In response to the content of the counter C2 read out in response to the signal C2R, the two lower significant digits of the keyed-in input data remaining in the register R3 are transferred to the lower significant positions of the register R2. (Since the keyed-in input data was divided by 3600 and then by 60, the remainder is less than 59.) Thereafter the content "10000" of the register R2 is transferred to the register R5 and is displayed in the display device DP as shown in FIG. 5. The counter C2 and the register R1 are cleared and the content; that is, data expressed in second representing one hour in the register R5 is transferred to the register R3.

Thereafter whether the function key = is depressed or not is detected in response to the signal from the flag FL2 and the flat FL4 is set to "1". Thus the equipment state is ready for the next keying operation.

When the numeral key 2 is depressed, the flag FL3 is consulted or detected whether it is "1" or not. Since it is set to "1", the register R1 is shifted left and the keyed-in input data "2" is entered into the register R1 and transferred to the register 6 in a manner substantially similar to that described above and is displayed on the display device DP. When the numeral key 3 is depressed, the state of the flag FL3 is detected and the register R1 is shifted so that "3" may be entered in the least significant position and transferred to the register R6 for display.

When the time unit key M is depressed, the keyed-in information is stored in memory means (not shown) and the data "23" is converted to be represented in seconds. That is, "60" is stored in the register R1 from where it is transferred to the register R2. In response to the detection of the depression of the minute unit key M, the data "23" in the register R6 is transferred to the register R1 and is exchanged with the content of the register R3. Therefore the content of the register R3 is "23" while the content of the register R1 is "3600"; that is, one hour in seconds.

Next is executed the operation of (data in register R1)+(data in register R2)×(data in register R3). The sum of the data "1380" seconds, that is equal to 23 minutes, and the data "3600" second, that is equal to one hour is entered into the register R1 and the counter C1 is increased by 1.

The content "4980" of the register R1 is transferred to the register R3. Since the content of the counter C1 is "3", both the counter C1 and the register R2 are cleared and the content of the register R3 is transferred to the register R5.

Thereafter the data of the register R3 is converted to be expressed in time unit, that is, in hour, minute and second in the manner described above, and is indicated as shown in FIG. 5 on the display device DP.

In like manner, number "45" is entered upon depression of the numeral keys 4 and 5 and the time unit key S is depressed. Then the data "12345" is entered into the register R6 while the data "5025" seconds is stored in the register. Thus the machine state is ready for the next key operation.

When the function key K + is depressed, the signal is transmitted to the flag FL2. Since the flag 4 is in the state "1" at this step, the state of data remains unchanged as will be described in detail in conjunction with the operations when AUTO key is depressed.

Next the augend, two hours 34 minutes 56 seconds, is entered by a sequence of key operations 2 H 3 4 M 5 6 S so that the augend in seconds is entered in the register 3 in a manner substantially similar to that described above in conjunction with the entry and unit conversion of the addend. When "2" is entered whether the flag FL3 is in the state "1" or not is detected. Since it is now reset by the depression of the function key +, the data "5025" stored in the register R3 is transferred to the register R4. Therefore the data which represents 2 hours 34 minutes 56 seconds is transferred to the register R3 in the manner described above and is displayed as shown in FIG. 5 when the second unit key S is depressed.

Upon depression of the function key F = , the data processing of the augend 2 hours 34 minutes 56 seconds in second unit and the content 0 of the register R1 is executed according to the content of the counter C1 in the manner described above. The result is transferred into the register R3 so that the content of the latter remains unchanged; that is, "9296".

Next in response to the content "3" of the counter C1, whether the function key F is depressed or not is detected, and the addition of the two data; that is, the addend, 1 hour 23 minutes 45 second=5025 seconds, and the augend, 2 hours 34 minutes 56 second=9296 seconds, is carried out and the result or sum is transferred to the register R3. Thereafter the counter C1 and the register R2 are cleared and then the content of the register R3 is transferred to the register R5.

Next the step for converting the data in the register R3 into time in hour, minute and second units is executed in the manner described above according to the content in the counter C2, and the time data in hour, minute and second unit is transferred from the register R2 to the register R6 for display.

Thereafter the counter C2 is cleared and the content of the register R5 is transferred again into the register R3 and then the register R1 is cleared.

Whether the function key=was depressed or not is detected. In this case, the answer is "yes" so that the registers R3, R4 and R5 are cleared. That is, all registers except the register R6 are cleared so that the computer will be ready for the next keying operation.

Upon depression of the function key F + following the depression of the AUTO key, a step is started for detecting whether the flag FL1 is in the state "1" or not. In this case, if the content of the counter C1 is "0" the F1 signal is transferred to the register R1 and in response to BTR4 signal it is also transferred to the register R4 through AND gate G3 and is displayed. In the manner described above, the numerical data "1 2 3 4 5 6" are entered digit by digit and are stored in the registers R1 and R4.

Upon depression of the function key +, whether the output from the flag FL2 is "1" or not is detected. If it is "1", the content of the counter C1 appearing on the output terminal C1R is sensed by the control unit CU. If the content is "0", the four-bit parallel data signal representative of "1" is transferred to the register R1 through AND gates G26, G20 and G24, the register SR2 and AND gate G23 during the timing mode signals M1 and M2=1, 1. That is, the content of the register R1 is "0 0 0 0 0 1".

The content of the register R1 is now transferred to the register R2 through AND gate G17, bus line B and AND gate G16. Thereafter whether the time or second unit key S is depressed or not is detected. In this case, the key S is not depressed, a sampling control of the register R6 is started.

When the timing mode signals M1 and M2 are zeroes, the signal Too from the timing generator TG appears at the terminals R6TB and BTR1 so that the data expressed in second; that is, "41" is sampled in the register R1. Thus the content of the register R1 changes to "0 0 0 0 5 6".

In response to EXR13 signal the exchange or swap of data is executed between the registers R1 and R3 and thereafter the arithmetic and logic operation unit ALU executes an operation of (data in register $R1$) + (data in register $R2$) × (data in register $R3$)

and puts the result into the register R1 and causes the counter C1 to increase by 1.

Next the data of minute unit; that is, "58" will be processed. First in order to convert the data in minute unit into data in second unit in accordance with the content of the counter C1, the content of the register R1 is transferred to the register R3. The signal T11 from the timing generator TG is applied to gates in the manner described above upon the timing mode signals M1 and M2=1, 1, the data "000006" is transferred from the terminal CD of the control unit CU to the register R1. The data in the register R1 is shifted to "000060" and transferred to the register R2 in response to the control signal from the control unit CU. When the timing mode signals M1 and M2=1 and 0, respectively, the data "3" in the register 6 is sampled and transferred to the register R1 in the manner described above. At this step the content of the register R1 is "005800", which is shifted by two positions to the right, resulting in "000058". The data in the registers R1 and R3 are exchanged or swapped and an operation of (data in register $R1$) + (data in register $R2$) × (data in register $R3$)

is executed and the result is entered into the register R1 and the counter C1 is increased by 1.

Thereafter the content of the register R1 is transferred to the register R3. In response to the content of the counter C1 the signal from the timing generator TG appears on the terminals CTB, and BTR1 of the control unit CU when the timing mode signals M1 and M2=1 and 1, respectively, so that the data "3" is stored in the register R1. The register R1 is shifted to the left and when the timing mode signals M1=1 and M2=1, the data "6" is entered. Thus the content of the register R1 is "36". The register R1 is shifted by two positions to the left so that the content thereof changes to "3600". The data "3600" is transferred to the register R2 in the manner described above. Thereafter the hour data; that is, "3" in the register R6 is sampled and stored into the register R1 in response to the signal T10 generated when the timing mode signal M1 and M2=1 and 0, respectively. Thus the content in the register R1 is "030000", which is shifted by four positions to the right to "12".

Thereafter the exchange or swap between the data in the registers R1 and R2 is carried out and the operation of (data in register $R2$) × (data in register $R3$)

is executed and the result is added to the content of the register R1. The counter C1 is increased by 1 and the content in the register R1 is transferred to the register R3. In response to the content "3" of the counter C1, the latter resets, and the data in second unit in the register R1 is transferred to the register R3.

Next in response to the content of the counter C1 the step of conversion to data expressed in second unit will be shifted to a step of detecting whether the function key + has been depressed or not. Therefore data in the registers R4 and R3 are added to each other and the sum is entered into the register R3 and the counter C1 and the register R2 are cleared.

Thereafter started is the step of converting the data in second unit in the register R3 into data in hour, minute and second unit so that the display device DP indicates the same numeral with that indicated prior to the depression of the function key +.

When the numerical data "12" is entered, the data in second unit in the register R3 is transferred to the register R4 and the input data is transferred through the register R1 to the register R6 for display.

Upon depression of the time or second unit key S, the same operations as those executed when the time unit key H, M or S is depressed after the function key + has been depressed in the addition of (1 hour 23 minutes 45 seconds) + (2 hours 34 minutes 56 seconds)

are executed. As a result, the data "12" is entered into the register R3 while the data "1 4 3 2 1" seconds equal to 3 hours 58 minutes 41 seconds is stored in the register R4. The operations which follow the depression of the function key = are the same as those described above, and 3 hours 58 minutes 53 seconds is indicated in the display device DP.

Even when the depression of the second unit key S is skipped prior to the depression of the function key =, AUTO signal ensures the same operations resulting in 3 hours 58 minutes 53 seconds.

As described above, when the AUTO key is depressed, the indicated time data in hour, minute and second may be converted into the data expressed in second unit when the equal function key = is depressed or the function key or keys depressed twice so that a further arithmetic operation may be continued. Alternatively, there may be provided memory means in which may be stored information representing that the data in the register R6 is in hour, minute and second unit after the equal key = was depressed or function key or keys was depressed twice.

As described above, according to the first preferred embodiment of the present invention, the arithmetic operations of time may be executed with a higher degree of accuracy because time data may be converted into time data in second unit. Furthermore time data discriminating means; that is, means for specifying the units are provided so that the data input may be considerably simplified.

Figure 6:
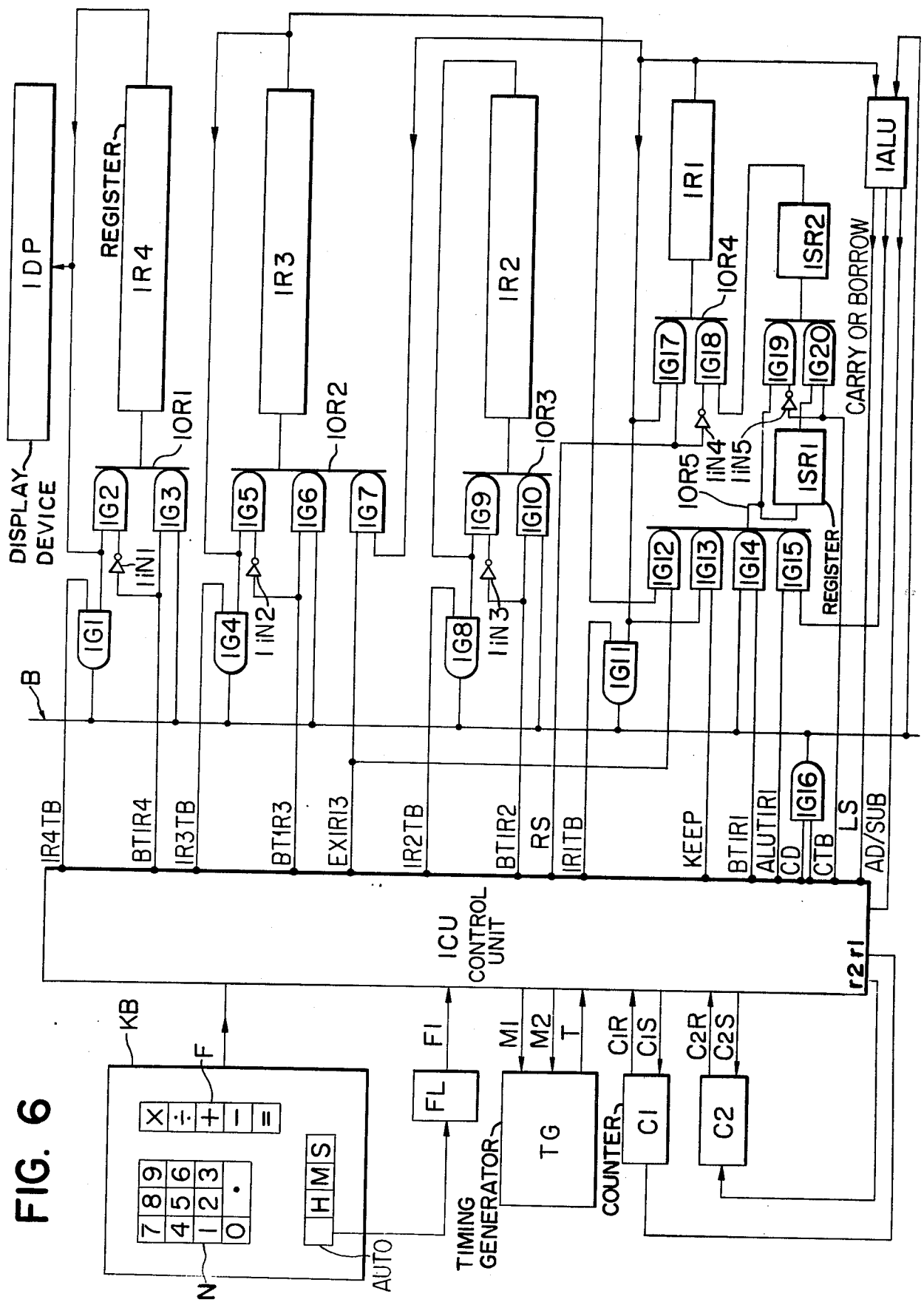
FIG. 6 is a block diagram of a second preferred embodiment of the present invention.
Figure 7A:
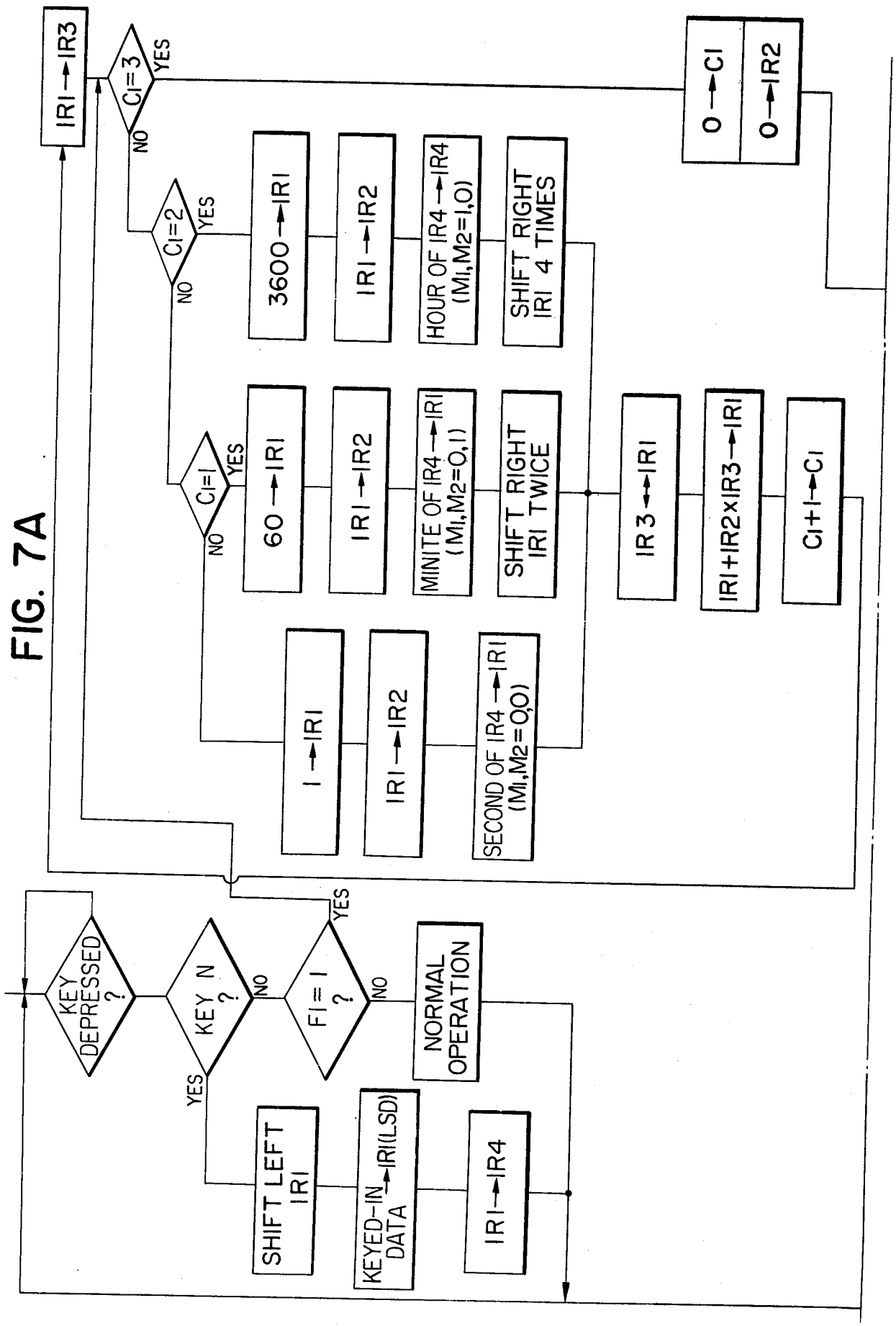
FIG. 7 is a flow chart used for explanation thereof.

Second Embodiment, FIGS. 6 and 7

The present invention has for its further object to provide electronic equipment incorporating means for automatically identifying input data or more particularly units of input data thereby simplifying and facilitating the data input.

More specifically the present invention may be applied to arithmetic operations involving time. For instance, to carry out a time calculation an automatic time calculation switch (to be referred to as "auto switch or key" hereinafter in this specification) is depressed so that of the data or digits keyed in from a keyboard the two lower significant digits, that is, the least significant digit and the next least significant digit are identified as numerical data expressed in second unit, the third and fourth position digits, as numerical data expressed in minutes; and digits in the fifth and above positions, as numerical data expressed in hour unit. These discriminated data in different units are stored in different registers.

FIG. 6 shows a block diagram of an electronic computer to which is applied the present invention. It has a keyboard having a plurality of keys, that is, numeral or digit keys 0-9 and decimal point (.), function keys +, −, ×, ÷ and =, time unit keys H, M and S and an auto switch or key of the type described above.

As in the first preferred embodiment described above, a control unit 1CU receives various signals not only from the keyboard but also various circuits and generates the control signals in response to the input signals as will be described in detail hereinafter. The control unit 1CU may be incorporated in a LSI tip.

A four-bit parallel register 1R1 is responsive to the control signals from the control unit 1CU and the signals from four-bit parallel register 1SR1 and 1SR2 for (1) shifting its content right or left, (2) storing therein the output from an arithmetic logic unit 1ALU as described in detail hereinafter, and (3) exchanging its content with that of another register described below.

The register 1SR1 has a function of delaying by one position of the content of the register 1R1 whereas the register 1SR2 is similar to register SR2 of the first preferred embodiment and has a function for shifting the content of the register 1R1 to the right without having it passed through the register 1SR2.

Four-bit parallel registers 1R2 and 1R3 are responsive to the control signals from the control unit 1CU for storing data or transferring it to another register. A four-bit parallel register 1R4 has a dural function of not only storing data and transferring it to another register but also delivering the data to a display device 1DP for display. The display device 1DP may consist of a plurality of well known 7-segment units.

An arithmetic and logic unit 1ALU executes an operation of data in the register 1R1 and data transmitted on a bus line 1B and enters the result into the register 1R1 and transmits CARRY or BORROW signal to the control unit 1CU in the case of an addition or subtraction which is in turn selected depending upon the signal AD or SUB from the control unit 1CU.

Figure 3:
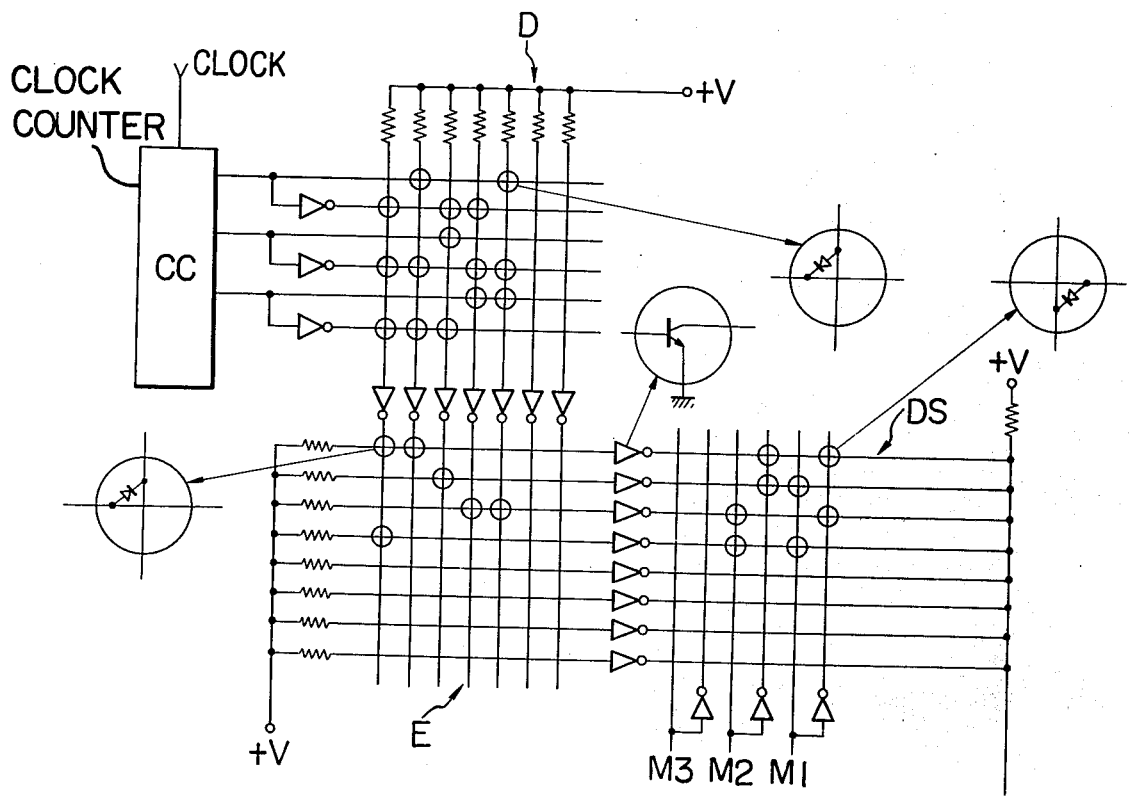
FIG. 3 is a circuit diagram of the timing generator TG.

The timing generator TG generates pulse signals as shown at a, b, c and d in FIG. 2 in response to the combination of the states of the timing mode signals M1 and M2 transmitted from the control unit 1CU. Its detail is shown in FIG. 3 wherein a clock counter CC is connected to a decoder D which is in turn connected to an encoder E connected to a data selector DS. The data selector DS is responsive to the timing mode signals M1 and M2 to select one of the outputs of the encoder E so that an output signal appears at an output terminal T.

A flag FL receives the output signal generated upon depression of the auto key to identify that the control unit 1CU is delivered with AUTO KEY signal.

AND gates 1G1–1G20, OR gates 1OR1–1OR6 and inverters 1iN1–1iN5 are so interconnected that in response to the output control signals from the control unit 1CU they control the operations of the registers 1R1–1R4.

A counter C1 is, for instance, a modulo-4 counter and is means for discriminating the units of data keyed-in. A counter C2 is a modulo-3 counter and is means for converting a time data in second unit into a time data in hour, minute and second unit.

Next the mode of operation of the second preferred embodiment with the above construction will be described with reference to the flow chart shown in FIG. 7.

As in the first preferred embodiment described above, the control unit 1CU generates the following signals at its output control signal terminals in response to the output signals from the keyboard KB and the states of various circuits described above:

| Terminals or Signals | Signals or Explanation |
|---|---|
| 1R4TB | Transfer data in register R4 on the bus line B |
| BT1R4 | Transfer data on the bus line B to the register 1R4 |
| 1R3TB | Transfer data in the register 1R3 on the bus line B |
| BT1R3 | Transfer data on the bus line B to the register 1R3 |
| 1R2TB | Transfer data in the register 1R2 on the bus line B |
| BT1R2 | Transfer the data on the bus line B to the register 1R2 |
| RS | Shift the data in the register 1R1 to the right |
| LS | Shift the data in the register 1R1 to the left |
| 1R1TB | Transfer the data in the register 1R1 on the bus line B |
| BT1R1 | Transfer the data on the bus line B to the register 1R1 |
| 1ALUTR | Transfer the output from the arithmetic and logic unit 1ALU to the register 1RL |
| M1, M2 | A two-bit signal in response to which the timing generator TG delivers the output signal at its output terminal T |
| EX1R13 | Exchange the data between the registers 1R1 and 1R3 |
| CD | A four-bit data signal from the control unit 1CU |
| CTB | Transfer CD signal on the bus line B |
| AD | Execute ADDITION in arithmetic and logic unit 1ALU |
| SUB | Execute SUBTRACTION in arithmetic and logic unit 1ALU |
| F1 | Signal derived when Auto key is depressed |
| KEEP | Hold the data in the register 1R1 |
| C1S | Increment the counter C1 |
| C2S | Increment the counter C2 |
| r1 | Reset the counter C1 |
| r2 | Reset the counter C2 |

The mode of operation will be described in conjunction with an addition of 12 hours 34 minutes 56 seconds to 7 hours 89 minutes 01 second.

First Auto key is depressed to actuate the flag FL to deliver F1 signal to the control unit 1CU.

Next the data, 12 hours, 34 minutes 56 seconds, is entered into the specified registers. That is, upon depression of the numeral keys in the sequence of 1, 2, 3, 4, 5 and 6, CD signals are sequentially delivered from the output terminal CD. The first CD signal representative of "1" is transferred on the bus line B through AND gate G16 in response to CTB signal and, in response to BR1R1 signal, it passes through AND gates G14 and G19 and is entered into the least significant position in the register 1R1. In response to 1R1TB signal it is further transferred through AND gate G11 on the bus line B and, in response to 1R1TB signal, it is transferred on the bus line B through AND gate 1G11 and is entered into the register 1R4 through AND gate 1G3 in response to the BR1R4 signal. The data in the register 1R4 is displayed in the display device DP. In like manner, the data signals are entered digit by digit into the registers 1R1 and 1R4. Thus the data in the registers 1R1 and 1R4 is "1 2 3 4 5 6".

Next the plus key + is depressed. Since the output from the flag FL is "1", the data in the register 1R1 is transferred on the bus line B in response to the signal 1R1TB and then in response to the BT1R3 signal the data is transferred to the register 1R3. The control unit 1CU reads the content of the counter C1 on the output terminal C1R and if the content is "0", the CD signal consisting of four parallel bits representing "1" is transferred to the register 1R1 through AND gates 1G16, 1G14 and 1G19, the register 1SR2 and AND gate 1G18 when the timing mode signals M1 and M2=1 and 1, respectively. Thus the content of the register 1R1 is "000001".

Thereafter the data in the register 1R1 is transferred to the register 1R2 through AND gate 1G11, the bus line B and AND gate 1G10.

When the timing mode signals M1 and M2=0 and 0, respectively, in response to the signal Too from the output terminal T of the timing generator TG transmitted to the output terminals R4TB and BT1R1 of the control unit 1CU, of the data expressed in second unit in the register 1R4 "56" is sampled and stored into the register 1R1. Thus the content of the register 1R1 will change to "000056".

Next in response to the EX1R13 signal, the data are exchanged between the registers 1R1 and 1R3 and the arithmetic and logic unit 1ALU executes an operation of $$\text{(data in register } 1R1) + \text{(data in register } 1R2) \times \text{(data in register } 1R3)$$

and the result is stored in the register 1R1 and the counter C1 is caused to be increased by 1.

Thereafter the data "34" in minute unit in the register 1R4 is sampled. That is, since the content of the counter C1 is "1", the data in the register 1R1 is transferred to the register 1R3 in order to convert the data in minute unit into the data in second unit, and when the timing mode signals M1 and M3=1 and 1, respectively, in response to the signal T11 from the timing generator TG applied to AND gates in the manner described above the data signal representing "000006" is transferred from the CD output terminal of the control unit 1CU to the register 1R1. The data thus transferred to the register 1R1 is shifted left to "000060", which is in turn transferred to the register 1R2 in response to the control signal from the control unit 1CU. When the timing mode signals M1 and M2=1 and 0, respectively, the data "34" in the register 1R4 is transferred to the register 1R1. The data, that is, "003400" in the register 1R1 is shifted twice to the right to "000034". Thereafter the data are exchanged between the registers 1R1 and 1R3 and the arithmetic and logic unit 1ALU executes an operation of $$\text{(data in register } 1R1) + \text{(data in register } 1R2) \times \text{(data in register } 1R3).$$

The result is stored in the register 1R1 and the counter C1 increases by 1.

Next the data in the register 1R1 is transferred to the register 1R3 and in response to the content of the counter C1 the output signal from the timing generator TG is transmitted to the control unit 1CU to deliver CTB and BR1R1 signals when the timing mode signals M1 and M2=1 and 1, respectively, so that the data "3" is entered into the register 1R1. Thereafter the data in the register 1R1 is shifted to the left, and when the timing mode signals M1 and M2=1 and 1, respectively, the next data "6" is entered. As a result, the data "36" is stored in the register 1R1. Thereafter the data is shifted to the left by two positions to obtain "3600", which is in turn transferred to the register 1R2 in the manner described above. Thereafter the data, that is, "12" in hour unit in the register 1R4 is sampled into the register 1R1 in response to the signal T10 generated when the timing mode signals M1 and M2=1 and 0, respectively. That is, the content of the register 1R1 changes to "120000", which is shifted right by four positions to "12".

The data are exchanged between the registers 1R1 and 1R3 and the arithmetic and logic unit 1ALU executes an operation of (data in register 1R2) × (data in register 1R3)

and the result is added to the content of the register 1R1 and the counter C1 is incrementally increased. The data in the register 1R1 is transferred to the register 1R3, and since the counter C1, which contains "3", will be reset and the register 1R2 also reset. Thus the computer is ready for the next keying operation.

The augend, that is, 7 hours 89 minutes 01 second is entered into the register 1R1 upon depressions of the numeral keys in the order of 7, 8, 9, 0 and 1 in a manner substantially similar to that described above and then is transferred to the register 1R4. Thus the contents of the respective registers are as follows:

| Registers | Contents |
| --- | --- |
| 1R1 | 0 7 8 9 0 1 |
| 1R2 | 0 0 0 0 0 0 |
| 1R3 | 0 4 5 2 9 6 (that is, 12 hours 34 minutes 56 seconds in second unit) |
| 1R4 | 0 7 8 9 0 1 |

Next the function key = is depressed. The succeeding operations are the same as those when the function key + was depressed so that the contents of the registers change as follows:

| Registers | Contents |
| --- | --- |
| 1R3 | 0 7 5 8 3 7 (the sum of addition of 12 hours 34 minutes 56 seconds to 7 hours 89 minutes 01 second) |
| 1R2 | 0 0 0 0 0 0 |
| 1R4 | 0 7 8 9 0 1 |

After the counter C1 and the register 1R2 have been reset, whether the function key = was depressed or not is detected. When the signal generated upon depression of the equal key = changes the state of memory means (not shown) in the control unit 1CU to "1", in response to the content of the counter C2 the data in the register 1R3 is converted into the data in hour, minute and second unit. That is, since the content of the counter C2 is "0", the data "3600" is entered into the register 1R1 in the manner described above. Thereafter the data are exchanged between the registers 1R1 and 1R3, and the subtraction of the data in the register 1R3 from the data in the register 1R1 is executed. The result will be stored in the register 1R1. If BORROW signal is derived from the arithmetic and logic unit 1ALU the sum of addition of data in register 1R1 and data in register 1R3 is stored in the register 1R1. If no BORROW signal is derived, the data in the register 1R1 is transferred to the register 1R4 and the sum of addition of the operation (data in register 1R2) + (data in register 1R1)

is stored in the register 1R1 and then transferred to the register 1R2. The above sequence of operations or steps of transferring the data in the register 1R4 to the register 1R1 is cycled until BORROW signal is derived. When BORROW signal is derived, the sum of addition of the data in the register 1R1 to the data in the register 1R3 is stored in the register 1R1 and then is transferred to the register 1R3. Thereafter in order to shift the data in the register 1R2 to the left, the content of the register 1R2 is transferred to the register 1R1 and the data in the register 1R1 is shifted left by two positions and then transferred again to the register 1R2. Thereafter the counter C2 is incrementally increased.

In response to the content of the counter C2 which appears at the output terminal C2R, the data "60" is entered into the register 1R1 in the manner described above and the data exchange is executed between the registers 1R1 and 1R3. The division is executed in the manner described above so that the data in minute unit may be derived. The quotient is entered into the register 1R2. If BORROW signal is derived, the divisor is added to the content of the register 1R1 and the content of the register 1R2 is shifted left by two positions and then the counter C2 is incrementally increased.

In response to the content (it being now "2") of the counter C2, the content (less than 59 at the most) of the register 1R3 is transferred to the two lower significant positions in the register 1R2. That is, in response to the output Too from the timing generator TG when the timing mode signals M1 and M2=0 and 0, respectively, the control unit 1CU delivers 1R3TB and BT1R2 signals so that the data in second unit is transferred to the register 1R2.

The data in hour, minute and second unit is transferred to the register 1R4 or display.

As described above, the second preferred embodiment of the present invention provides an electronic equipment with means for discriminating the units of input data so that a minimum number of keys can be provided and a number of keying strokes can be considerably reduced.

Third Embodiment, FIGS. 8-13

Next referring to FIGS. 8-13 a third preferred embodiment of the present invention as applied to an electronic computer will be described. In the third embodiment the units or radixes of numerical data can be determined to execute arithmetic operations. More specifically the third embodiment has means which is capable of handling as data expressed in time unit an input numerical data entered without depression of the time unit keys because it can identify the numerical data in hour, minute and second units according to their digit positions. Furthermore the third embodiment can discriminate automatically whether the result of arithmetic operations between the time data is expressed in the decimal notation or not, thereby indicating the result in hour, minute and second unit or second unit.

In FIG. 8 there is shown a keyboard KB for entering data into a computer. It has time unit keys H, M and S, a mode key "auto" upon depression of which the computer automatically identifies the numerical data or digits expressed in hour, minute and second units of an input time data entered without depression of the time unit keys H, M and S, a key SC for changing the sign of an input data, numeral keys N, function keys F, ×, ÷, + and −, a function execution key FE = and a clear key CA. The keyboard also has a display device DDP having numerical display units ND, decimal point or unit display units CD, an error display unit ED and time or hour, minute and second unit display units CCD, each display unit consisting of a plurality of light-emitting segments or electrodes which are driven in a time-division or static manner.

Figure 9:
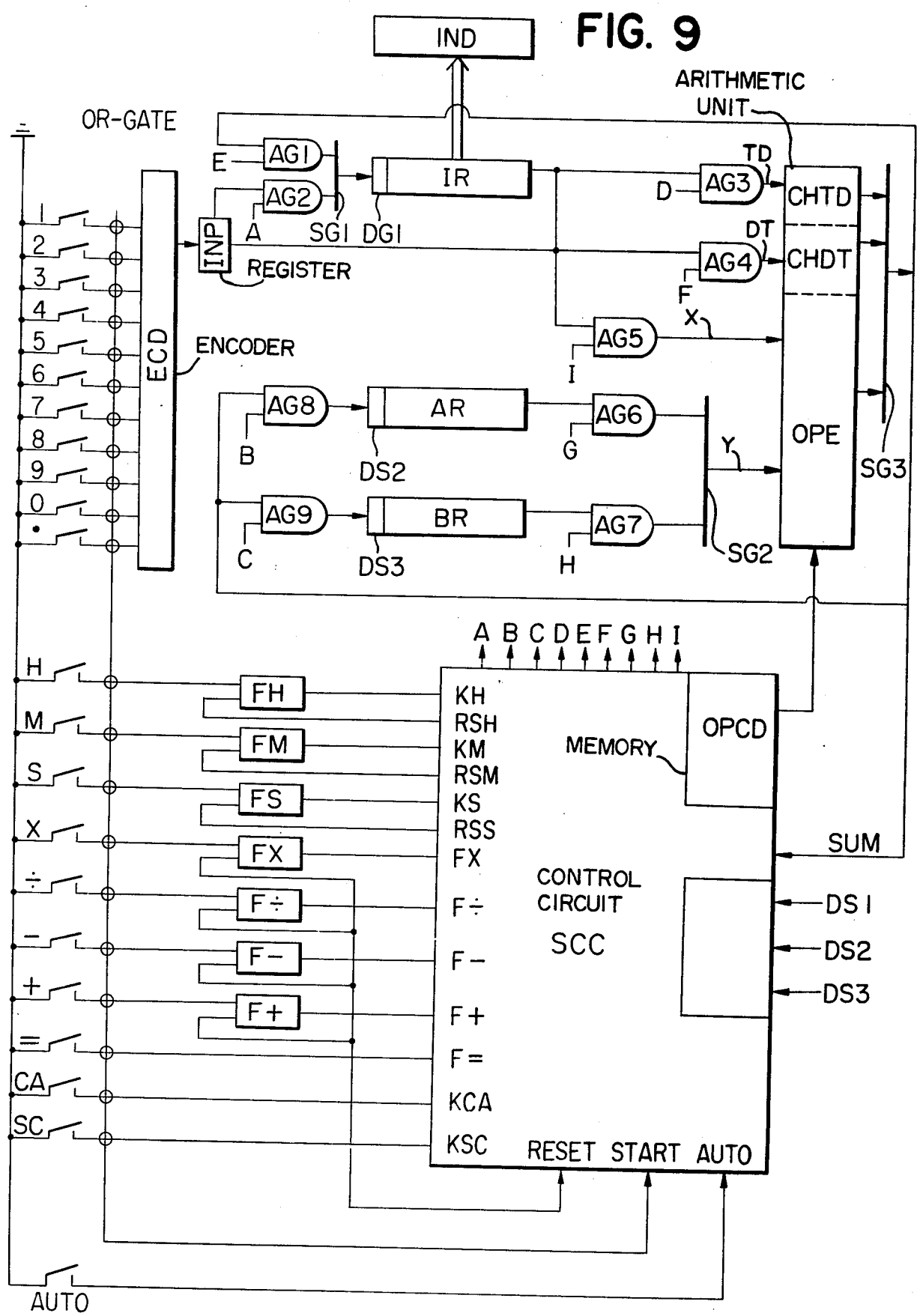
FIG. 9 is a block diagram of the third embodiment.

In FIG. 9 there is shown in block diagram of the third embodiment wherein the numerical keys N are denoted by 0–9 and (.); the time unit keys, by H, M and S, the function keys, by ×, ÷, +, − and =; the "auto" key, by auto; the clear key, by CA, and the sign-change key by SC.

The computer further includes an encoder ECD for delivering an encoded signal in response to an input signal entered upon depression of one of the numerical keys N, a numerical data register INP for storing the output signal from the encoder ECD, a register IR for storing an input data for dispay and registers AR and BR which are used in the case of the arithmetic operations.

In FIG. 10 there is shown the construction of the respective registers. The register has a numerical data storage R capable of storing an 8-digit decimally coded number, a decimal point information storage EX, a sign information storage S and a unit or radix information storage DS, the radix information representing whether the numerical data stored is expressed in the decimal notation or in time unit, that is, in hour, minute and second unit.

Referring back to FIG. 9, an arithmetic unit AU consists of three operatively interconnected circuits, that is, a circuit CHDT for converting a decimal number into a number expressed in time or hour, minute and second unit, a circuit CHTD for converting a number expressed in time unit into a decimal number and an operation circuit OPE. The arithmetic unit AU has inputs X, Y, TD and DT and an output SUM.

Coded instructions such as shown in FIG. 11 are stored in a memory OPCD for specifying an arithmetic operation to be executed in the arithmetic unit AU. An indicator IND includes the display device DDP.

Decision instructions for specifying the contents of the registers IR, AR and BR are stored in memories DS1–DS3. Flip-flops F×, F+, F− and F+ store arithmetic instructions while FH, FM and FS store hour, minute and second instructions. The arithmetic unit AU and the registers IR, AR and BR are interconnected through AND gates AG1–AG9 and OR gates SG1–SG3 as shown. In response to input signals from various circuits a control circuit SSC controls AND and OR gates, the arithmetic unit AU and flip-flops.

These circuits, gates and flip-flops may be realized in the form of an LSI.

Figure 12B:
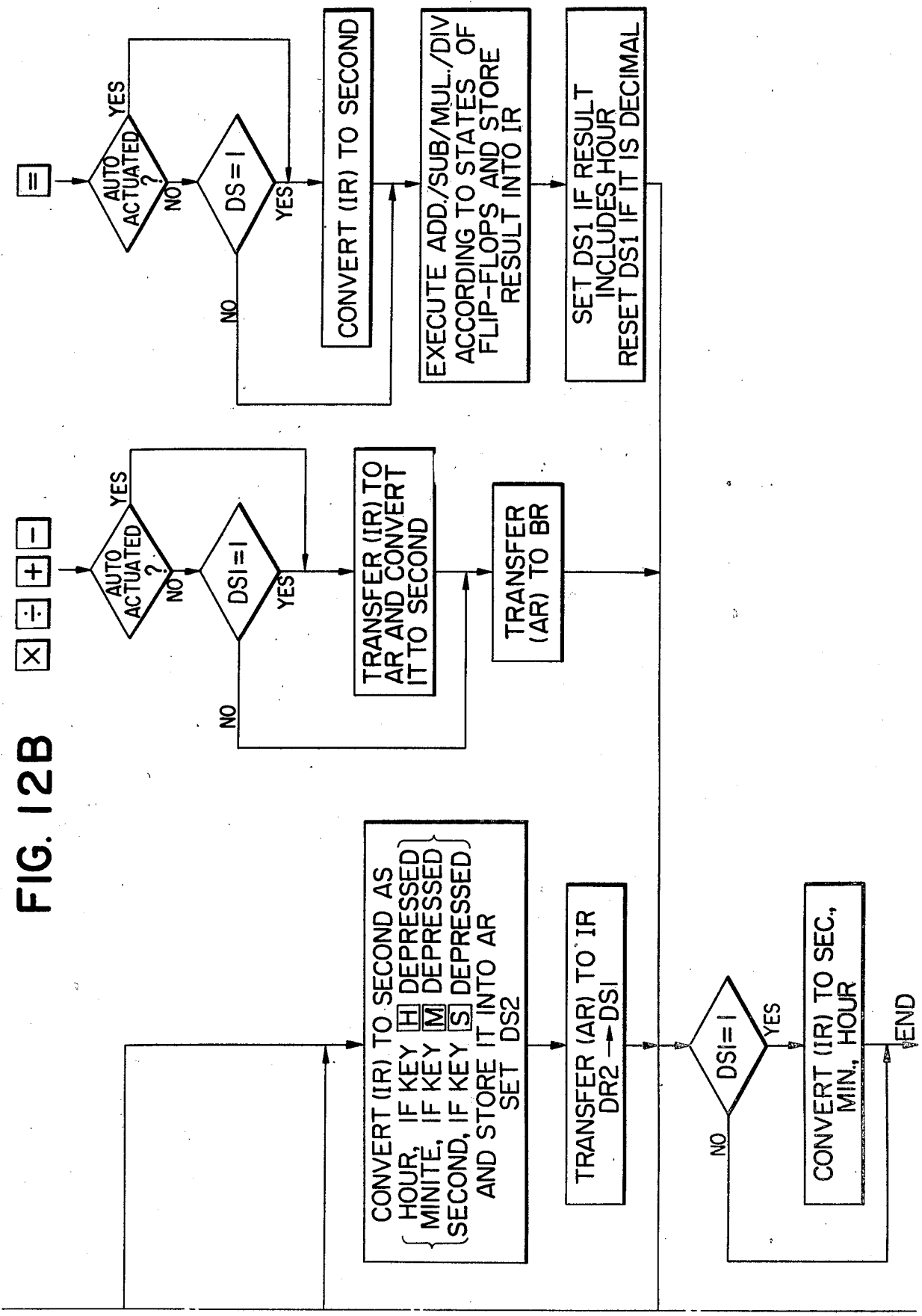

The mode of operation of the third embodiment with the above construction will be described with further reference to FIGS. 12 and 13.

Prior to the entry of time input data, that is, 3 hours 15 minutes 13.2 seconds, the clear key CA is depressed to reset the registers and flip-flops. To enter "3", the numeral key N "3" is depressed. Then START signal is applied through an OR gate, to which are applied all keyed-in outputs, to a START terminal of the control unit SSC so that the output signal representing "3" from the encoder ECD is transferred to the register IR through an input register INP and AND gate AG2 as shown in FIG. 13.

Next in order to weight the input data "3" with hour, the hour unit key H is depressed to generate the signal which is transmitted through the OR gate to the flip-flop FH to set it. In response to the output from the flip-flop FH, the control circuit SSC detects whether the input numeral data has been entered and then starts the operation of converting the data "3" to represent it in second unit. That is, in response to the data "3" in the register IR, the conversion circuit CHDT enters into the register AR 3600 (in second) three times so that the content of the register AR is "10800", that is, 3 hours expressed in second unit. Thereafter in order to signal that this data is time data, the memory DS2 is set. Next the content of the register AR is transferred to the register IR whereas the content of the memroy DS2 is transferred to the memory DS1, and in response to the content of the memory DS1 the data in the register IR is processed.

That is, in order to display the data in the register IR in hour, minute or second unit, the control circuit SSC causes the circuit CHDT to subtract "3600" from the content of the register AR after the content of the register AR has been transferred to the register IR and to add "1" in the time position in the register IR. Therefore the content of the registers change as shown in FIG. 13-b. In this case, in response to the content of the memory DS1, a plurality of decimal points are turned on to indicate the hour, minute and second units. Instead of the decimal points, any suitable light-emitting segments may be employed.

Next the data in minute unit is entered by the depressions of the keys in the order of [1] [5] [M]. Upon depression of the numerical key [1], the content of the memory DS1 is read out so that the control circuit SSC converts the data in the register IR into the data expressed in second unit which is in turn transferred to the register AR. Since the data stored in the register IR may be discriminated or divided into the numeral data in hour, minute and second units starting from the least significant digit, the conversion into second unit may be accomplished in the manner described above.

In order to enter the input data "1" into the register IR, the register IR is cleared and thereafter the data "1" is entered into the least significant position in the register IR, and the memory DS1 is cleared.

Next the data "5" is entered. Since "5" is not the first digit of the numeral data in minute unit, it is entered into the register IR so that the content thereof changes to "15". Next the key M is depressed so that the flip-flop FH which has been set upon depression of the hour unit key H is reset, and the operation of converting the data in the register IR into the data expressed in second unit is started in response to the output signal from the flip-flop FM. The result is added to "10800" and stored in the register AR. Thus, the content of the register AR is now "11700".

Next the data in the register AR is transferred to the register IR. Since the content of the memory DS1 is "1" the data in the register IR is converted by the conversion circuit CHTD to be displayed in time unit as shown at C in FIG. 13.

Next the data in second unit is entered as shown at D in FIG. 13 upon depression of the keys in the order of [1] [3] [.] [2] [S]. Thus the whole operand has been entered.

Next the mode of operation of subtracting 20.5 minutes from the subtrahend 3 hours 15 minutes 13.2 seconds will be described. When the numerical key "2" is depressed, in response to the content of the memory DS1 the content of the register IR is converted into the data in second unit by the conversion circuit CHTD and then is transferred to the register AR. Thereafter, "2" is transferred to the register IR through the input register INP, and since the data in the register IR is a decimal number the memory DS1 will be cleared.

When "0" is entered, the control circuit SCC discriminates it as not being the first or most significant digit so that it is entered into the register IR. Next the numeral keys ▢ and ⑤ are depressed in the order named so that number "20.5" is now entered into the register IR, the decimal point being stored in the decimal point storage EX.

Next the change-sign key SC is depressed. In response to the outputs from the OR gate and the key SC, the control circuit SCC sets the sign memory S in the register IR as shown in FIG. 13 at E.

Upon depression of the minute unit key M, the output signal from the OR gate is applied to the control circuit SCC so that the latter senses that the data in the register IR has a negative sign. As a result, the control circuit SCC causes the arithmetic unit AU to subtract "60" (in second unit) from the data in the register AR 20 times (that is, 20 minutes of 20.5 minutes) and to subtract "6" (which equals 0.1 minute) five times (that is, 0.5 minutes). As a result the content of the register AR changes to "10483.2" (in second unit) = 11713.2 − 1230 (in second unit) = 3 hours 15 minutes 13.2 seconds − 20.5 minutes.

Thereafter in order to convert the result "10483.2" (in second unit) into the result expressed in hour, minute and second unit the control circuit SCC causes the arithmetic unit AU to subtract 3600 (= one hour) from the data 10483.2 (in second unit sequentially, and "1" is entered in the hour digit position in the register IR each time when "3600" is subtracted. After the content of the register AR has been reduced to a number less than 3600, "60" (which equals to one minute) is sequentially subtracted as many times as possible, and "1" is entered in the minute digit position in the register IR each time when "60" is subtracted. The remaining content of the register AR after it has been reduced less than "59" is in second unit and therefore entered in the second digit position in the register IR. The above sequence of operations executed in the arithmetic unit AU is controlled in accordance with the arithmetic instructions stored in the memory OPCD in the control circuit SCC. Thus the result, 2 hours 54 minutes 43.2 seconds is displayed as shown at F in FIG. 13.

Next the mode of operation of dividing the result by the decimal number "4" will be described. For this purpose, the keys are depressed in the order of ÷ ④ ▣ . Upon depression of the division key ÷, the control circuit SSC causes the arithmetic unit AU to convert the displayed data 2 hours 54 minutes 43.2 seconds into the data in second unit by the time-unit-to-decimal conversion circuit CHTD. The result is transferred to the register BR. Since the data in time unit or hour, minute and second unit has been converted into the data in second unit, the content of the memory DS1 is also transferred to the memory DS3. Thus the contents of the indicator and registers change as shown at G in FIG. 13.

When the divisor "4" is entered, the contents of the registers and indicator change as shown at H in FIG. 13. Thereafter the equal key = is depressed. Since the divisor "4" is a decimal number and not a number expressed in time unit, the result of the division is expressed in time unit. This condition is indicated in the memory DS1 in the register IR. Thereafter the control circuit SCC transmits an instruction for executing the division of data in register BR by data in register IR to the arithmetic unit AU, and the result is entered into the register IR. Since the result is "2620.8" in second unit, the control circuit SCC causes the arithmetic unit AU to convert the result in second unit into the result expressed in time or hour, minute and second unit by the conversion circuit CHDT as shown at I in FIG. 13. That is, the content of the register IR is the result; that is, 43 minutes 40.8 seconds; the content of the register AR is the result in second unit; that is, 2620.8 seconds and the content of the register BR is the divisor "4".

In like manner, the multiplication, subtraction, and addition may be executed.

Next the decimal-to-sexagesimal or sexagesimal-to-decimal conversion mode will be described. For this purpose, the key M is depressed twice. That is, the first depression is to attain the conversion of the result 43 minutes 40.8 seconds into a decimal number in minute unit, whereas the second depression is for attaining the conversion of a decimal number expressed in minute unit into a number in time or hour, minute and second unit.

First the sexagesimal-to-decimal conversion will be described. Upon depression of the key M, the control circuit SCC is activated in response to the output signal from the OR gate. It detects that the memroy DS1 is in the state "1" so that the data in the register IR is converted into a decimal number by the conversion circuit CHTD in the arithmetic unit AU. Since the key M is depressed, the data will be converted into a decimal number in minute unit. That is, the data in time or hour, minute and second unit in the register IR is converted into a decimal number in second unit by the conversion circuit CHTD and is transferred to the register AR. Thereafter "60" (which equals to one minute) is subtracted from the data in the register AR as many as times possible, and the number of subtractions is entered in the register IR. In order to represent in minute unit the remainder or fractional part in second unit, "6" (second) which is equal to 1/10 of 60 seconds or one minute is subtracted from the remainder, and the number of subtractions possible is entered at the first position right to the decimal point. In like manner, number 0.6 (seconds) is subtracted from the remainder as many times as possible and the number of subtractions possible is entered to the second position to the right of the decimal point. In like manner the remaining fractional part may be converted into a decimal number in minute unit. Thus the result is shown at J in FIG. 13, that is, the data, 43 minutes 40.8 seconds, is converted into 43.68 minutes upon depression of the key M.

When the key M is further depressed, the decimal data, 43.68 minutes, is converted into the number in time or hour, minute and second unit as shown at K in FIG. 13.

So far the present invention has been described in conjunction with time or sexagesimal notation, but it will be understood that the present invention may be equally applied to various systems of units, weights and measures, such as Degree, Minute and Second Unit System wherein
  1 degree = 60 minutes
  1 minute = 60 seconds
  a fraction of a second is a decimal in second unit
Metric Measures of Length wherein
  1 meter = 100 centimeters
  1 centimeter = 10 millimeters British Measures of Length wherein
1 yard = 3 feet
1 foot = 12 inches
(1 mile = 1,760 yards)
Japanese Measures of Length wherein
1 ken = 6 shaku
1 shaku = 10 sun
(1 ri = 2,160 ken)
British Measures of Weight wherein
1 ton = 2,240 pounds
1 pound = 16 ounces.

In summary, the present invention provides means which discriminates or senses whether input data is a decimal or sexagesimal number and which converts the input data into a decimal or sexagesimal number so that the arithmetic operations may be much more facilitated.

What we claim is:

1. Electronic data processing equipment comprising:
   an input keyboard including a set of decimal number keys for entering digits of decimal numbers, a unit indicating key for entering a time unit, instruction keys for entering instructions corresponding to the four fundamental arithmetic rules, and an execution key for permitting the instructions to be executed;
   a first numeral storage for storing digits entered from said decimal number keys;
   a time unit storage for storing a time unit entered from said unit indicating key;
   an instruction storage for storing instructions entered from said instruction keys;
   first conversion means for converting the digits stored in said first numeral storage into resultant numerical data with the unit of seconds in accordance with the time unit stored in said time unit storage to develop the resultant numerical data;
   control means responsive to said instruction keys for storing in a second storage means the resultant data developed from said first conversion means, and for storing in a portion of said second storage means an information signal specifying the resultant data as time data;
   operation processing means responsive to said execution key for processing the resultant numerical data stored in said storage means and the digits stored in said first numeral storage in accordance with the instructions stored in said instruction storage to generate second resultant data;
   second conversion means responsive to said execution key for identifying said information signal, and for converting the second resultant data obtained from the processing of said operation processing means into numerical data having units of hours, minutes and/or seconds in accordance with the magnitude of the second resultant data; and
   means for visualizing the numerical data converted in said second conversion means.

2. Electronic data processing equipment according to claim 1, wherein said first conversion means includes means for separating the digits stored in said first numeral storage into a plurality of predetermined digit positions, and means for providing the digit positions separated by said separating means with time units "hour", "minute", and "second", respectively.

3. Electronic data processing equipment in accordance with claim 2, wherein said digit position providing means provides the first and second least significant digits of the number received by said numeral input means with the unit of "seconds", the third and fourth least significant digits of the number with the unit of "minutes" and a digit more significant than the fourth significant digit of the number with the unit of "hours".

4. Electronic data processing equipment comprising:
   an input keyboard including decimal number keys for entering digits, a unit indicating key for entering a time unit, instruction keys for entering instructions corresponding to the four fundamental arithmetic rules, a mode key for selecting between a first mode and a second mode, and an execution key for permitting the instructions to be executed;
   a first numeral storage for storing digits entered from said decimal number keys;
   a time unit storage for storing a time unit entered from said unit indicating key;
   an instruction storage for storing instuctions entered from said instruction keys;
   means responsive to selection of said second mode by said mode key for providing digits of the number entered from said decimal number keys with a predetermined one of a plurality of units in accordance with the positions of the digits of the number;
   first conversion means responsive to selection of said first mode by said mode key for converting the digits stored in said first numeral storage into resultant numerical data with a predetermined unit in accordance with the time unit stored in said time unit storage to develop the resultant numerical data, and responsive to selection of said second mode by said mode key for converting the digits stored in said first numeral storage into resultant numerical data with a predetermined unit in accordance with said providing means to develop the resultant numerical data;
   control means responsive to said instruction keys for storing in a second storage means the resultant data developed from said first conversion means, and for storing in a portion of said second storage means an information signal specifying the resultant data as time data;
   operation processing means responsive to said execution key for processing the resultant numerical data stored in said second storage means and the digits stored in said first numeral storage in accordance with the instructions stored in said instruction storage to generate second resultant data;
   second conversion means responsive to said execution key for identifying said information signal, and for converting the second resultant data obtained from the processing of said operation processing means into numerical data having units of hours, minutes and/or seconds in accordance with the magnitude of the second resultant data; and
   means for visualizing the numerical data converted in said second conversion means.

* * * * *

UNITED STATES PATENT AND TRADEMARK OFFICE
CERTIFICATE OF CORRECTION

PATENT NO. : 4,458,325  Page 1 of 3
DATED : July 3, 1984
INVENTOR(S) : SHINICHI NAKATA, ET AL.

It is certified that error appears in the above-identified patent and that said Letters Patent is hereby corrected as shown below:

Title Page

Line 75, change "Shegeru" to --Shigeru--.

Column 3

Delete lines 60 and 61 in their entirety.

Column 4

Line 30, change "second" to --seconds--,

Line 37, change "LTR1" to --BTR1--.

Column 5

Line 16, change "remaining" to --remains--,

Line 65, change "second" to --seconds--.

Column 7

Line 7, change "second" to --seconds--,

Line 8, change "second" to --seconds--,

Lines 56-57, insert --is-- before "expressed",

Line 57, change "second" to --seconds--.

Column 9

Line 25, change "second" to --seconds--,

UNITED STATES PATENT AND TRADEMARK OFFICE
CERTIFICATE OF CORRECTION

PATENT NO. : 4,458,325

DATED : July 3, 1984

INVENTOR(S) : SHINICHI NAKATA, ET AL.

It is certified that error appears in the above-identified patent and that said Letters Patent is hereby corrected as shown below:

Column 9 (Continued)

Line 27, insert --are-- before "depressed".

Column 10

Line 24, change "dural" to --dual--.

Column 15

Line 43, change "F+", first occurrence, to --F$\div$--.

Column 16

Line 22, change "change" to --changes--,

Line 24, change "are" to --is--.

UNITED STATES PATENT AND TRADEMARK OFFICE
CERTIFICATE OF CORRECTION

PATENT NO. : 4,458,325          Page 3 of 3

DATED : July 3, 1984

INVENTOR(S) : SHINICHI NAKATA, ET AL.

It is certified that error appears in the above-identified patent and that said Letters Patent is hereby corrected as shown below:

Column 18

Lines 37-38, change "as times" to --times as--.

Signed and Sealed this

Fifth Day of March 1985

[SEAL]

Attest:

DONALD J. QUIGG

Attesting Officer     Acting Commissioner of Patents and Trademarks